United States Patent [19]

Gewebler et al.

[11] Patent Number: 4,829,402
[45] Date of Patent: May 9, 1989

[54] CIRCUIT BOARD RETAINER AND PANEL ASSEMBLY

[75] Inventors: Ytzhak Gewebler, La Mirada; Alexander S. Torok, Cypress, both of Calif.

[73] Assignee: Lockhart Industries, Inc., Paramount, Calif.

[21] Appl. No.: 244,542

[22] Filed: Sep. 12, 1988

Related U.S. Application Data

[63] Continuation of Ser. No. 68,635, Jun. 30, 1987, abandoned.

[51] Int. Cl.⁴ .................................................. H05K 7/20
[52] U.S. Cl. ....................................... 361/383; 361/388; 361/415; 211/41; 439/377
[58] Field of Search ................................. 165/80.2, 80.3; 248/316.1, 316.2; 211/8, 41; 277/12, 228; 439/260, 329, 377; 74/110; 361/383–388, 415

[56] References Cited

U.S. PATENT DOCUMENTS

| | | | |
|---|---|---|---|
| 2,228,044 | 1/1941 | Barclay | 52/768 |
| 3,970,198 | 7/1976 | Prater | 211/41 |
| 4,375,290 | 3/1983 | Zucchi | 361/415 |
| 4,493,010 | 1/1985 | Morrison | 361/415 |
| 4,502,601 | 3/1985 | Husted et al. | 211/41 |
| 4,531,175 | 7/1985 | Reimer | 211/41 |
| 4,536,824 | 8/1985 | Banett | 361/388 |
| 4,648,009 | 3/1987 | Beun | 361/415 |

FOREIGN PATENT DOCUMENTS 2103020  2/1986  United Kingdom ................ 361/386

Primary Examiner—Gerald P. Tolin
Attorney, Agent, or Firm—John E. Wagner

[57] ABSTRACT

A circuit board panel and chassis assembly comprises hollow panels for mounting circuit boards and a chassis provided with ducting communicating with inlets and outlets in the faces of the hollow panels for the circulation of coolant. Expansible retainers for sealing the inlets and outlets of the panels to the chassis ducting also free the panels from the chassis upon release of the panels and are operable by levers accessible from the exterior of the chassis.

9 Claims, 4 Drawing Sheets

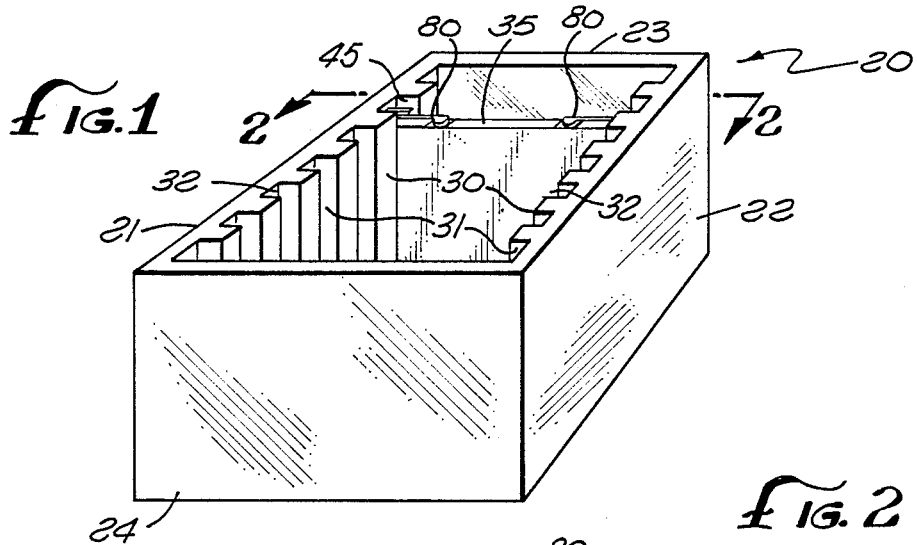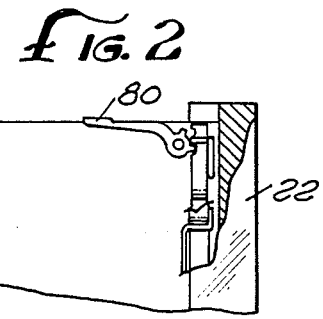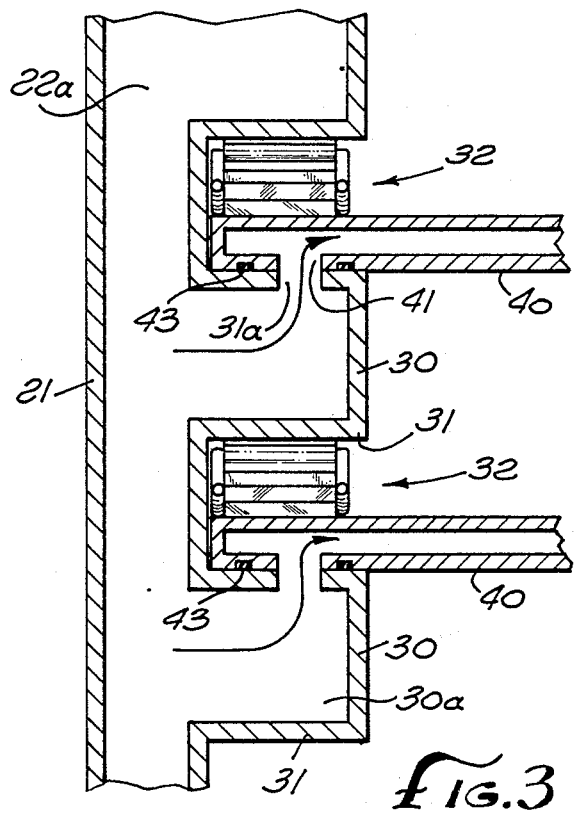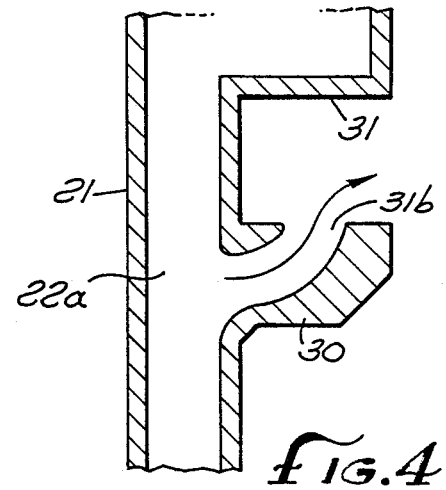

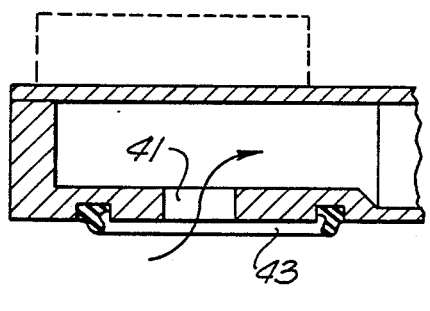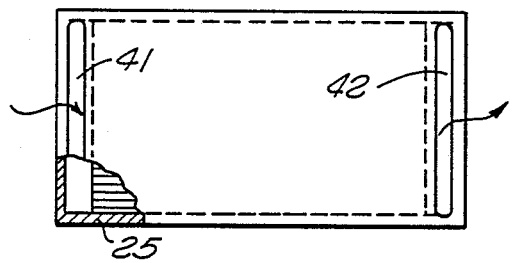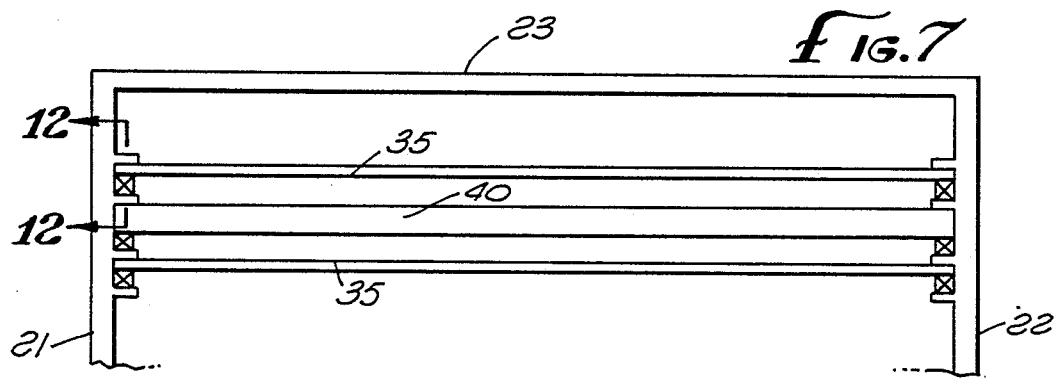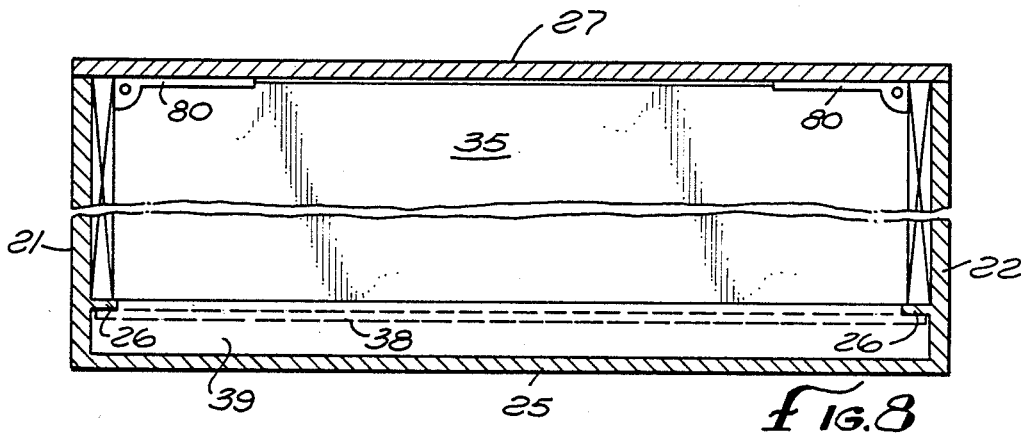

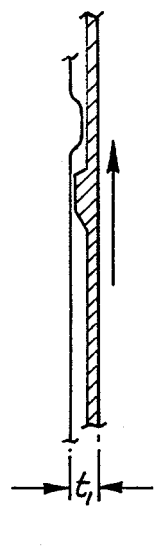
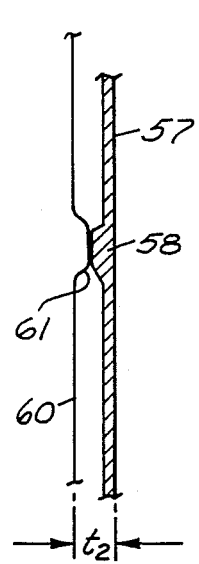
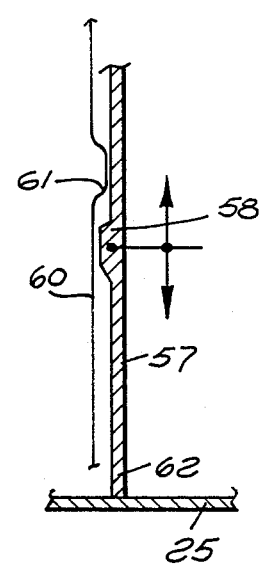
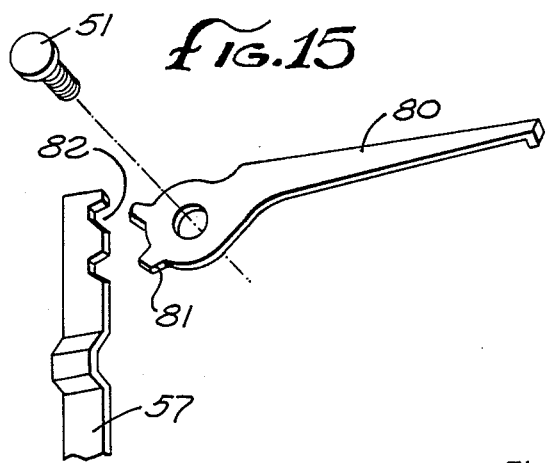
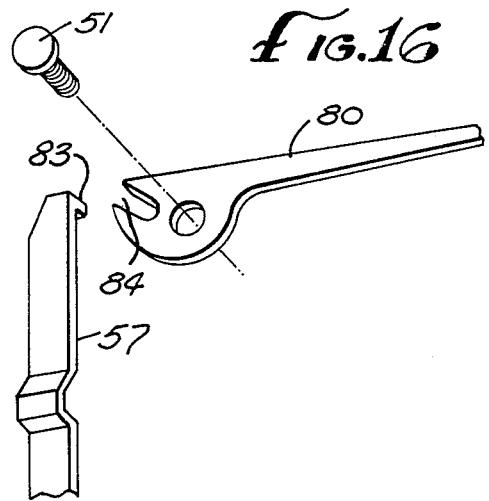
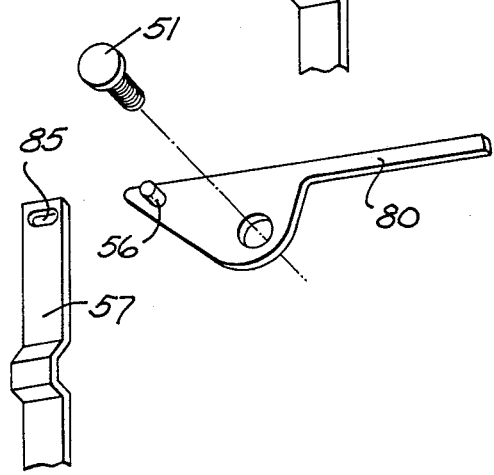

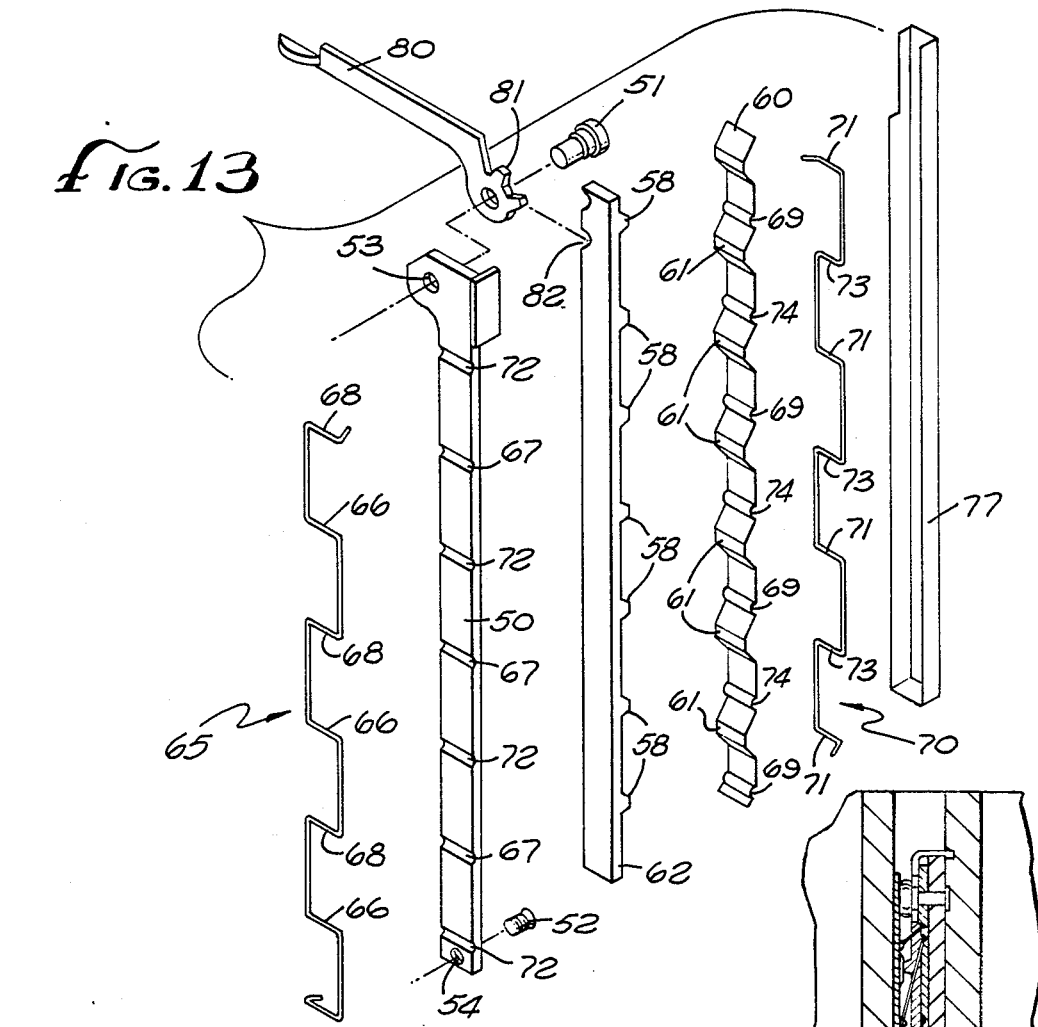
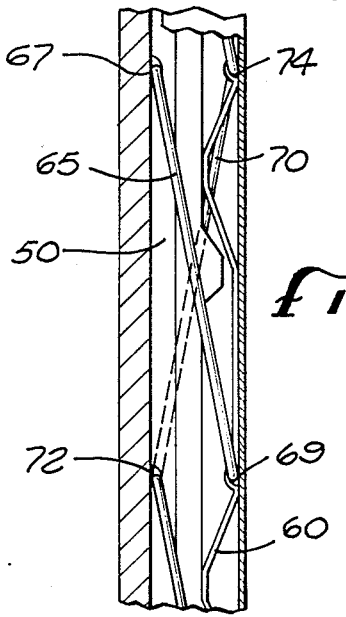
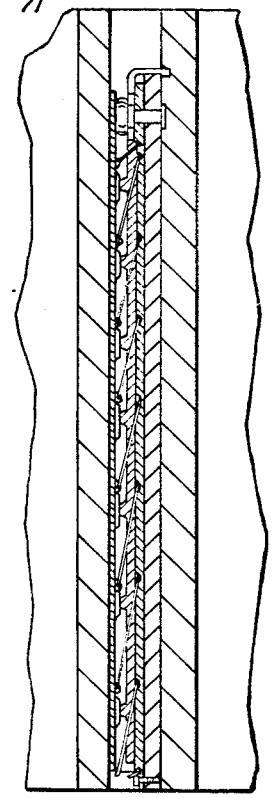

CIRCUIT BOARD RETAINER AND PANEL ASSEMBLY

This is a continuation of application Ser. No. 07/068,635 filed June 30, 1987, now abandoned.

BACKGROUND OF THE INVENTION

1. Field of the Invention

The present invention relates to an improved circuit board panel assembly and to an improved retainer particularly for use therewith. More particularly it relates to improvements in retainers for retaining panels including circuit boards in racks and to a novel fluid-cooled chassis, or rack, in which the retainer is especially useful.

2. Description of the Prior Art

The virtually universal use of printed circuit boards in the electronics industry has led to the development of a wide variety of chassis structures, or racks, in which a number of such boards can be mounted in a compact group connected at one edge, usually by contacts on the board's edge which engage sockets, to a common mother board.

In order to retain boards in their racks more securely than by the sockets alone, various types of retainers have been developed, examples of which are disclosed in the Prater U.S. Pat. No. 3,970,198 and Husted et al. U.S. Pat. No. 4,502,601.

The requirements of advancing technology have created a need for an improved retainer which is of utility in all applications in which a board is to be retained in a rack, and easily inserted or removed.

The principal objects of the present invention are to provide an improved retainer capable of elastically wedging a board within its rack slot while compensating for variations in the dimensional tolerances of the board and its slot; which acts to press the board or its carrier against a side of its slot in the chassis, adapting it for use in applications in which a coolant is to be circulated from the chassis into the board's interior and which may be easily actuated or released without the aid of any tool. Of particular importance is the object of developing an improved retainer which may be operated easily with gloved hands, as in a military aircraft. One further object if to develop a retainer which self aligns the printed circuit board on insertion and eliminates the need for connectors having aligning pins.

A further object of this invention in to provide a side opening cooling assembly in which the openings in the chassis and each cooled circuit board are on the side and mating under the pressure of the improved retainer. Effective sealing of the circuit board openings to the chassis is obtained and improved cooling is facilitated. Other objects and advantages of the invention will become apparent from the following description.

SUMMARY OF THE INVENTION

The retainer of the present invention comprises a pair of elongated strips, one of which is resiliently compressible, and both of which have cam surfaces on their facing sides, so that upon relative lengthwise movement engaging the cam surfaces with each other, the space between the strips is widened. Thus, when an assembly including such strips is placed between a panel inserted into a chassis slot and a side wall of the slot, such expansion of the space between the strips will resiliently compress the assembly and hold the panel firmly in place in the chassis slot.

Also according to the present invention, cooling of a hollow panel carrying a circuit board may be reliably effected by the provision of chassis ducting terminating in ports of one side wall of each of the slots provided for the reception of the circuit board carrying panels, and the provision of mating ports in the panel faces adjacent to the opposite edges of the panels. In such an application, the retainer of the present invention has special utility by reason of its capability of producing an effective seal between the chassis coolant ports and those in the hollow panels.

BRIEF DESCRIPTION OF THE DRAWING

FIG. 1 is a view in perspective of a chassis, or rack, provided with a series of slots for circuit boards, or panel showing one panel secured in place in opposite slots by a retainer embodying the present invention.

FIG. 2 is a detail view, partly in section taken on the line 2—2 of FIG. 1, showing detail of the retainer actuating device.

FIG. 3 is an enlarged detail view in section taken on the line 3—3 of FIG. 2, of a portion of a cooled chassis, side wall connected to a hollow panel and sealed by the retainer of the present invention.

FIG. 4 is a detail view in section of an alternative chassis side wall structure.

FIG. 5 is a detail view in section of the inlet port of a hollow panel and its seal with the retainer location indicated by slotted lines.

FIG. 6 is a detail view in side elevation of a hollow panel showing its inlet and outlet ports for coolant.

FIG. 7 is a detail view in plan of a portion of a chassis or rack showing panels of different thicknesses in place in a standard chassis therein retained by the retainer of the present invention.

FIG. 8 is a view in vertical section of a chassis, or rack, with a circuit board in place; connected at its lower edge to a mother board; and with the cover of the rack in place.

FIGS. 9, 10, and 11 are diagrammatic views showing the lateral dimensional increase of the retainer effected by the action of its camming surfaces, and the ejecting action of the movable cam carrying element.

FIG. 12 is an enlarged detail view in vertical section on the line 12—12 of FIG. 7 showing a portion of the retainer in its expanded state as after actuation between a panel and slot wall.

FIG. 13 is an exploded perspective view of the retainer of the present invention.

FIG. 14 is an enlarged detail view, similar to FIG. 12 by showing the parts of the retainer in their collapsed state.

FIGS. 15, 16, and 17 are detail views of different modifications of the lever device employed in the retainer.

DETAILED DESCRIPTION OF THE PREFERRED EMBODIMENTS

As shown in the accompanying drawings, the circuit board panel and chassis assembly of the present invention comprises a chassis structure, or rack, 20 (FIG. 1) having oppositely disposed side walls 21 and 22, end walls 23 and 24, a bottom 28 and a removable cover, unshown. The facing inner surfaces of the side walls 21 and 22 present a series of ribs 30 on the sides 31 which are normal to the planes of the side walls 21 and 22 thus defining slots 32 between each pair of ribs 30.

The panel units of the assembly comprise either relatively thin printed circuit boards 35 of FIG. 7 or, in applications in which internal cooling of the panel assembly is required, hollow circuit board mounting panels 40 of FIGS. 1, 3, and 6 in both cases dimensioned so that their edges extend into the grooves 32 of the chassis 20 and so that their upper edges are spaced from the upper edges of the walls 21 and 22 as indicated at 45 (FIG. 1) for a purpose hereinafter described.

The circuit boars 35 or panels 40 of FIGS. 3 and 5 or FIG. 7 respectively, whether or not mounted on a panel 40, conventionally carry male edge connectors or contacts along their lower edges seen in FIG. 8 which, when the boards are fully inserted into slots 32, engaging the force mating connector carried by a mother board 38 which may be either secured to the inside of the bottom 25 of chassis 20 or to a shelf 26 on the inside of each side wall 21, 22 of chassis 20, leaving a space 39 below the mother board 38 for the wiring of the latter.

Desirably the edge connectors used are designed so that the frictional contact between the parts while making a dependable electrical connection, is light enough so that boards may be inserted between the row of edge connectors without excessive pressure on the upper edge of the board or panel. Therefore, in order to hold each board or panel in position in the chassis, retainer assemblies are provided for holding each edge of each board or panel in the chassis groove in which it has been inserted against one side wall of the groove and more specifically against side walls of opposite ribs.

As is illustrated in FIG. 13, each of these retainers comprises an elongated base 50 adapted to be secured to the face of a circuit board or panel adjacent each edge thereof by screws 51 and 52 passing through holes 53 and 54, respectively, in the base 50. Slidably mounted on one face of the base 50 and substantially coextensive therewith is an elongated slide 57 carrying on its face, remote from the base 50, a series of cams 58. Next to the cams 58 there is positioned for engagement with cams 58, an elongated, resilient pressure strip 60 of spring metal substantially coextensive with the slide 57. Viewed edgewise, as in FIGS. 12 and 14, the resilient pressure strip 60 is bowed to provide a series of cams 61 which engage the cams 58 of the slide 57 upon endwise movement of the latter. Between the cams 61, the resilient pressure strip 60 is provided with grooves 69 for a purpose which will be described. The base 50 and resilient pressure strip 60, as well as actuator 57, the last of which is endwise between them, are held together by wire springs 65 and 70. The wire spring 65 has anchoring lateral portions 66 fitting grooves 67 in the face of the base 50 remote from the slide 57 and other lateral portions 68 fitting grooves 69 in resilient pressure strip 60. The wire spring 70 has anchoring lateral portions 71 fitting grooves 72 in base 50 and other lateral portions 73 fitting grooves 74 in resilient pressure strip 60. This arrangement is such that, as shown in FIG. 14, as one part of wire 65 passes from one of the grooves 67 in base 50 to one of the grooves 69 in resilient pressure strip 60, the opposite part of wire 70 passes from one of the grooves 74 in resilient pressure strip 60 to one of the grooves 72 in base 50; this pattern being repeated over the lengths of both wire springs. Finally, a cover member 77 encloses the sides of the retainer assembly and forms a shoe between resilient pressure strip 60 and a side wall of a rib 30.

The cam surfaces 61 of resilient pressure strip 60 complementing the cams 58 of the actuator 57 and so positioned with respect to the latter that movement of the actuator 57 from the position shown diagrammatically in FIG. 9 where the cam surface 58 and 61 are disengaged, to the position similarly shown in FIG. 10 where the cam surfaces 58 and 61 are engaged will enhance the thickness of the retainer assembly from that designated t1 to that designated t2 in FIG. 10, thus compressing the resilient pressure strip 60 to hold the attached board or panel firmly in the slot in which it has been inserted.

Endwise movement of slide 57 is effected by a lever 80 pivotally mounted on an unthreaded shoulder or fastener 51 and provided with teeth 81 engaging notches 82 in the adjacent edge of slide 57; this arrangement being such that movement of the lever 80 from a horizontal position to a position approximately 45 degrees above the horizontal will move the slide 57 a distance sufficient to disengage the cam surfaces 58 of the slide 57 from the cam surfaces 61 of the resilient member 60. Additional movement of the lever 80 to an approximately vertical position will extend the lower end 62 of the slide 57 beyond the lower end of the actuator assembly against the bottom 25 of the chassis 20 (FIG. 11) or the shelf 26 (FIG. 8), to move the retainer assembly and the circuit board 35 or panel 40 connected to it upwardly, a distance sufficient to disengage the boards' contacts from the connector 37 and also move the board or panel upwardly a sufficient distance to facilitate grasping it for removal, as shown diagrammatically in FIG. 11.

While the preferred configuration of the connection between lever 80 and slide 57 is that described above and shown in detail in FIG. 15, alternative configurations are shown in FIGS. 16 and 17. In FIG. 16, the upper end of slide 57 is formed at a right angle to the body of the slide as at 83 and is engaged in a notch 84. In FIG. 17, the upper end of slide 57 is formed with a slot 85 and the lever 80 is provided with a pin 86 extending into the slot. In all of these embodiments the levers are easily operated by a gloved hand as may be required in cold environments or in a military aircraft. The levers act as handles for extracting and inserting the printed circuit board without any direct contact of the board by the user.

One further advantage of this invention resides in the fact that the printed circuit board plus the retainer assembly elastically fill the slot during insertion, locking and removal. No alignment pins, commonly found in connectors, are required. The alignment pins and their associated lockets commonly use 10 to 20 percent of the overall length of a connector and secure no recessive function other than to align the circuit board. In this invention, the retainer and the board edge accomplish this alignment function with very little of the printed circuit board edge dimension but to the alignment requirements. Therefore more edge connector contacts may be used when employing this invention.

FLUID COOLED PANELS

The retainer of the present invention has special utility in applications in which a fluid coolant, which may be air, is to be circulated through the interiors of panels carrying printed circuit boards. In such applications, the side walls 22 and 23 and ribs 30 are made hollow as shown at 22a and 30a in FIG. 3, and a port is provided in one side of each rib 30 as shown at 31a. Desirably, however, the ducting of coolant from the walls 22 and 23 is effected through a curved duct 31b as shown in FIG. 4. Each of the hollow panels 40 is provided with an inlet port 41 (FIGS. 5 and 6) and an outlet port 42; the latter being configured in the wall 22 in the same manner as the inlet is configured. As illustrated in FIGS. 3 and 5, each of these ports are preferably sealed by a conventional seal 43. The retainers of this invention applying a relatively uniform force along the length of the panel 30 insures proper sealing and effective cooling.

In use, the retainers of the present invention are preferably attached to the circuit boards 30 or panels 40 as described above and the boards or panels are inserted in the grooves of the chassis with the actuator levers 80 in their vertical positions. During the insertion of the board's connectors into the mother boards sockets, the actuator levers are moved to approximately 45 degrees with the horizontal position, and all of them must be horizontal in line with the upper end of the board opposite to the connector before the cover 27 can be properly positioned on the chassis.

Removal of any selected board from the chassis is effected by moving both of its actuator levers 80 to their vertical positions. As illustrated in FIGS. 9, 10 and 11, this releases the pressure wedging the board in the slot and then presses the lower ends 62 of the actuators 57 against the chassis bottom 25, raising the attached board or panel sufficiently to disengage the board contacts from the mother board sockets and elevates the upper edge of the board so that it may easily be grasped for removal, by taking hold of the board or the levers of the locking devices.

I claim:

1. A circuit board panel assembly including additionally; comprising a chassis structure including a pair of oppositely disposed walls having on their facing surfaces a plurality of ribs presenting sides normal to the planes of said surfaces and a groove between each pair of ribs, coolant ducting in each of said walls terminating in a port in one wall of each of said ribs, a circuit board panel having opposite faces and edges extending into opposite ones of said grooves, a cavity within said circuit board panel connecting with inlet and outlet ports in one face of said panel connecting with said chassis ports with said panel positioned in said grooves, and retainer means within each of said grooves between the other face of said panel and the adjacent rib for selectively compressing the one face of said panel against the side of the other adjacent rib to establish sealed communication between said inlet and outlet ports of the one face of said panel and matching parts in said grooves.

2. A releasable retainer for positioning between the face of a circuit board panel adjacent one edge thereof and the wall of a chassis slot comprising an elongated slide carrying on one face thereof a series of cams, a resilient pressure strip of spring metal having a plurality of bows opposite the face of said slide carrying said cams, and means for effecting relative endwise movement of said slide and pressure strip to engage said cams and bows and move said slide and pressure strip apart to exert pressure between the face of the panel and the wall of a chassis slot, further including additionally a first wire spring disposed in a generally spiral path embracing said slide and said resilient pressure strip and holding them in assembled relationship with freedom for limited movement toward and away from each other.

3. A releasable retainer according to claim 1 including, additionally, an elongated base adapted to be secured to a face of a circuit board panel;
said slide being slidable endwise on said base.

4. A releasable retainer according to claim 1 including an additional wire spring which forms a pair of wire springs with said first wire spring, said pair of wire springs being disposed in opposite, generally spiral paths embracing said slide and said resilient pressure strip and holding them in assembled relationship with freedom for limited movement toward and away from each other.

5. A releasable retainer according to claim 3 including additionally a wire spring disposed in a generally spiral path embracing said base, slide and resilient pressure strip and holding them in assembled relationship with freedom for limited movement of said slide and strip toward and away frome each other and for endwise movement of said slide.

6. A releasable retainer according to claim 3 including additionally a pair of wire springs disposed in opposite, generally sprial paths embracing said base, slide and resilient pressure strip and holding them in assembled relationship with freedom for limited movement of said slide and said strip toward and away from each other and for endwise movement of said slide.

7. In a circuit board panel assembly comprising a chassis having a pair of opposite, facing walls connected by an end wall;
each of said facing walls having grooves extending across the face thereof, and one or more circuit board panels removably received in opposite pairs of said grooves;
the improvement comprising means secured to said one or more panels selectively operable to retain said one or more panels in said grooves or to release the same for removal therefrom;
beyond the panel edge adjacent to said end wall and said means including a relatively movable member extensible into engagement with said end wall to bear against said end wall and to partially eject said panel from said chassis.

8. A circuit board panel assembly according to claim 7 in which said means is operable to first release said panel from said grooves and to then engage said member and said end wall.

9. A circuit board panel assembly comprising a chassis structure including a pair of oppositely disposed walls having on their face surfaces a plurality of ribs presenting sides normal to the planes of said surfaces and a groove between each pair of ribs;
ducting in at least one of said walls terminating in a port in a wall of one of said ribs;
a circuit board panel having opposite faces and edges extending into opposite ones of said grooves;
a cavity within said circuit board panel connecting with a port in one face of said panel which in turn connects with said chassis port with said panel positioned in said grooves; and
retaining means between the other face of said panel and the adjacent rib for selectively compressing the face of said panel against the side of the other adjacent rib.

* * * * *

UNITED STATES PATENT AND TRADEMARK OFFICE
CERTIFICATE OF CORRECTION

PATENT NO. : 4,829,402

DATED : May 9, 1989

INVENTOR(S) : Ytzhak Gewelber, Alexander S. Torok

It is certified that error appears in the above-identified patent and that said Letters Patent is hereby corrected as shown below:

On the title page:

The correct spelling of the surname of the first inventor is:

Ytzhak Gewelber

Signed and Sealed this

Seventh Day of May, 1991

*Attest:*

HARRY F. MANBECK, JR.

*Attesting Officer*    *Commissioner of Patents and Trademarks*